United States Patent [19]

Venes et al.

[11] Patent Number: 5,633,638
[45] Date of Patent: May 27, 1997

[54] FOLDING STAGE FOR A FOLDING ANALOG-TO-DIGITAL CONVERTER

[75] Inventors: Arnoldus G. W. Venes; Bram Nauta, both of Eindhoven, Netherlands

[73] Assignee: U.S. Philips Corporation, New York, N.Y.

[21] Appl. No.: 498,097

[22] Filed: Jul. 5, 1995

[30] Foreign Application Priority Data

Jul. 7, 1994 [EP] European Pat. Off. .............. 94201958

[51] Int. Cl.$^6$ .............................................. H03M 1/00
[52] U.S. Cl. .................................... 341/155; 341/133
[58] Field of Search .................................. 341/155, 156, 341/158, 159, 133, 134, 135, 136

[56] References Cited

U.S. PATENT DOCUMENTS

| 4,386,339 | 5/1983 | Henry et al. | 340/347 |
| 5,307,067 | 4/1994 | Kimura et al. | 341/159 |
| 5,376,937 | 12/1994 | Colleran et al. | 341/159 |

OTHER PUBLICATIONS

"An 8-bit 100-MHz Full-Nyquist Analog-to-Digital Converter" by Rudy J. Van de Plassche et al, IEEE Journal of Solid-State Circuits, vol. 23, No. 6, Dec. 1988, pp. 1334-1344.

"An 8-bit Video ADC Incorporating Folding and Interpolation Techniques" by Rob E.J. Van de Grift et al, IEEE Journal of Solid-State Circuits, vol. SC-22, No. 6, Dec. 1987, pp. 944-953.

Primary Examiner—Howard L. Williams
Attorney, Agent, or Firm—Bernard Franzblau

[57] ABSTRACT

A folding stage for a folding analog-to-digital converter comprising a plurality of consecutive reference terminals for providing ascending different reference voltages; a first summing node, a second summing node and a first output node. A plurality of differentially coupled transistor pairs with each one of the pairs comprising a first transistor having a main current path and a control electrode which is coupled to an input terminal for receiving an input voltage to be folded and a second transistor having a main current path and a control electrode which is coupled to a respective one of the consecutive reference terminals. The main current path of the first transistor of consecutive transistor pairs is coupled alternately to the first summing node and the second summing node, and the main current path of the associated second transistor is coupled alternately to the second summing node and the first summing node. A dummy structure comprising a first current source, a first dummy transistor having a control electrode coupled to the input terminal, a first main electrode connected to the first current source and a second main electrode coupled to one of the first and second summing nodes, a second current source, and a second dummy transistor having a control electrode coupled to a bias voltage terminal, a first main electrode connected to the second current source and a second main electrode coupled to the other of the first and second summing nodes. The dummy structure reduces capacitive error currents in the differential output current which flows in the summing nodes of the folding stage by providing cancelling currents to the summing nodes.

15 Claims, 4 Drawing Sheets

FOLDING STAGE FOR A FOLDING ANALOG-TO-DIGITAL CONVERTER

BACKGROUND OF THE INVENTION

This invention relates to a folding stage for a folding analog-to-digital converter, the folding stage comprising:

an input terminal for receiving an input voltage to be folded;

reference means having a plurality of consecutive reference terminus for providing ascending different reference voltages;

a first summing node and a second summing node;

a plurality of differentially coupled transistor pairs, each one of the pairs comprising a current source, a first transistor having a first main electrode coupled to the current source and a control electrode coupled to the input terminal and a second transistor having a first main electrode coupled to the current source and a control electrode coupled to a respective one of the consecutive reference terminus, the second main electrode of the first transistor of consecutive transistor pairs being coupled alternately to the first summing node and the second summing node, and the second main electrode of the associated second transistor being coupled alternately to the second summing node and the first summing node.

Such a folding stage is known from U.S. Pat. No. 4,386,339. Folding stages are commonly used in analog-to-digital (A/D) converters.

Important considerations in designing an A/D converter are speed, component count and resolution. Full flash conveyers have a relatively simple architecture. To convert an analog input voltage into an N-bit digital output code, a full flash conveyer normally employs $2^N-1$ input comparators for comparing the input voltage with $2^N-1$ corresponding reference voltages. The principal disadvantage of the full flash converter is the high component count due to the large number of input comparators. Several schemes have been proposed to reduce the number of components.

The folding technique is one of the schemes for reducing component count. Folding architectures have been successfully implemented in very high speed bipolar A/D converters. See R. van de Grift et al., "An 8-bit Video ADC Incorporating Folding and Interpolating Techniques", IEEE Journal of Solid-State Circuits, Vol. SC-22, No. 6, December 1987, pp 944–953. Also see R. van de Plassche et al., "An 8-bit 100-MHz Full-Nyquist Analog-to Digital Converter", IEEE Journal of Solid-State Circuits, Vol. 23, No. 6, December 1988, pp 1334–1344. The basic principles of the folding architecture are extensively explained in these references. A folding A/D converter comprises a number of folding stages, each comprising a set of differential pairs responding to the input voltage and a corresponding set of reference voltages. The outputs of the differential pairs are combined in such a way as to generate one or more single ended folding signals or pairs of complementary folding signals having a repetitive rounded triangular or sine wave shape as a function of the input voltage. The folding signals of the folding stages are supplied to respective one's of a group of sample latches for converting the folding signals to a group of least significant bits of the digital output code. The most significant bits are supplied by a group of coarse comparators which operate on the input voltage along a separate channel. In this way the number of latches can be reduced considerably. The number of latches is reduced by the number of times the input signal is folded by the folding stages. However, each latch requires its own folding signal and each folding stage requires as many differential pairs as the number of times the signal has been folded. The more efficient use of the latches is therefore offset by an increasing number of differential pairs in the folding stages. As also known from the aforementioned IEEE-references, the number of folding stages can be reduced by interpolating between the folding signals of the folding stages to generate additional folding signals without the need for more folding stages. In this way the interpolation reduces the number of folding stages by the interpolation factor. A combined folding and interpolating architecture results in a compact low-power A/D converter.

The folding technique is also useful in other A/D architectures. In U.S. Pat. No. 4,386,339 a direct flash A/D converter is disclosed having independent parallel A/D converters for each bit. Each independent bit-encoder has a folding stage coupled to a single comparator which provides a bit of directly encoded compact binary output. In this way conversion from thermometer code to binary code is not needed.

A folding stage thus can be used in several distinct A/D converter architectures. However, a problem arises when the folding stage known from U.S. Pat. No. 4,386,339 is to be used at high frequencies. The folding system implies that the frequency of the folding signal will be a multiple of the frequency of the input signal to be folded. The actual internal frequency is related both with the input frequency and the amplitude of the input signal. For example, an 8 times folding system requires a 125 MHz bandwidth at a maximum input frequency $F_{in,max}=10$ MHz. At high speed operation these high frequencies lead to capacitive error signals in the folding signal caused by parasitic capacitances between the control electrode (gate or base) and first main electrode (source or emitter) of the transistors in the differentially coupled transistor pairs and by capacitances present at the common current source of the transistor pairs.

SUMMARY OF THE INVENTION

It is an object of the invention to provide a folding stage for use in a folding analog-to-digital converter which is less sensitive to capacitive error currents.

For this purpose the folding stage as specified in the opening paragraph is characterized in that the folding stage further comprises a dummy structure comprising a first current source, a first dummy transistor having a control electrode coupled to the input terminal, a first main electrode connected to the first current source and a second main electrode coupled to one of the first and second summing nodes, a second current source, and a second dummy transistor having a control electrode coupled to a bias voltage terminal, a first main electrode connected to the second current source and a second main electrode coupled to the other of the first and second summing nodes.

The dummy structure reduces the capacitive error current in the differential output current which flows in the summing nodes of the folding stage by providing cancelling currents to the summing nodes.

In a folding stage many transistors are connected to the summing nodes. Parasitic capacitances of the transistors of the differential pairs may also deteriorate the output currents in the summing nodes. The currents through the parasitic capacitances can be relatively large compared to the differential current swing and may reduce the desired accuracy. It is therefore advantageous to keep the voltage swing at the summing nodes as small as possible to prevent unacceptable capacitive currents through the parasitic capacitances. For this purpose a folding stage according to the invention may be further characterised in that the folding stage further comprises:

a first output node;

current-to-voltage converter means comprising a first resistor connected between the first summing node and the first output node to provide a first output voltage and having an input coupled the first summing node and a transconductance stage having an inverting input coupled to the first summing node and an output coupled to the first output node.

The output voltage at the first output node is proportional to the resistance R of the first resistor. The input impedance of the transconductance stage is equal to $1/g_m$, $g_m$ being the transconductance of the transconductance stage. The output impedance of the transconductance stage is also $1/g_m$. A large transconductance provides a low input impedance to reduce the voltage swing and thus the capacitive currents. A large transconductance further provides a low output impedance. This allows for a large resistance R to provide a large output voltage at the output node. The output voltage and the output impedance can be designed separately by selecting suitable values for the resistance R of the first resistor and for the transconductance $g_m$ of the transconductance stage. This makes connection possible to a low impedance interpolation network. A low impedance level of the interpolation network is less sensitive to parasitic capacitances and thus allows higher speed.

The two summing nodes of the folding stage need a bias current. Mismatch between the two bias currents causes offset in the output currents of the folding stage. This offset results in non-linearity errors of a folding A/D converter and should be avoided as much as possible. In order to reduce the mismatch of the bias currents an embodiment of the folding stage according to the invention is characterized in that the folding stage further comprises a first bias current source coupled to the first output node for providing a first bias current to the first summing node via the first resistor.

By moving the bias current source from the summing node to the output node, the bias current now flows through the first resistor and an error in the bias current has a factor $g_m R_1$ ($R_1$ is the resistance of the first resistor) less effect. The effect of mismatch can be reduced considerably. A factor 16 is obtained at values of $g_m=4$ mA/V and $R_1=4$ kOhm.

The output voltage of the folding stage can be single ended. A folding stage having a differential output is characterized in that -the folding stage further comprises a second output node;

the current-to-voltage converter means further comprises a second resistor connected between the second output node and the second summing node to provide a second output voltage; and the transconductance stage has a non-inverting input coupled to the second summing node and an inverting output coupled to the second output node and preferably further in that the folding stage further comprises a second bias current source coupled to the second output node for providing a second bias current to the second summing node via the second resistor.

For high speed applications the generation of differential signals is preferred since it greatly improves the reliability and robustness of a folding A/D converter under noisy conditions corresponding to a digital environment.

The transconductance stage may be implemented in any suitable way. A simple differential transconductance stage comprising only a few components is characterized in that the transconductance stage comprises a first transistor and a second transistor having first main electrodes coupled to a common current source, having second main electrodes coupled to the first output node and the second output node, respectively, and having control electrodes coupled to the first summing node and the second summing node, respectively.

This differential transconductance stage may further comprise a third resistor connected between the first output node and the second summing node and a fourth resistor connected between the second output node and the first summing node.

The third and fourth resistors are cross-coupled and provide a lower DC voltage drop between the summing nodes and the output nodes, while maintaining the same differential signal amplification. For common-mode signals (bias currents) the first and third resistors are seen in parallel. The same holds for the second and fourth resistors. For differential mode (signal currents) the first and third resistors are seen in parallel with a minus sign for the third resistor, thereby effectively increasing the parallel resistance. The same holds for the second and fourth resistors.

To further improve the accuracy, in the folding stage in at least two of the plurality of differentially coupled transistor pairs, the control electrode of the second transistor is coupled to a reference terminal supplying a reference voltage which lies outside the voltage range of the input voltage to be folded.

The two differential pairs generate void zerocrossings at the end of the input voltage range. By this extension of the folding structure outside the voltage range of the input signal, all differential pairs are equally influenced by adjacent pairs.

BRIEF DESCRIPTION OF THE DRAWINGS

The above and other features and advantages of the invention will be apparent from the following description of exemplary embodiments of the invention with reference to the accompanying drawings, in which.

Like reference symbols are employed in the drawings and in the description of the preferred embodiments to represent the same or very similar item or items.

DESCRIPTION OF THE PREFERRED EMBODIMENTS

Figure 1:
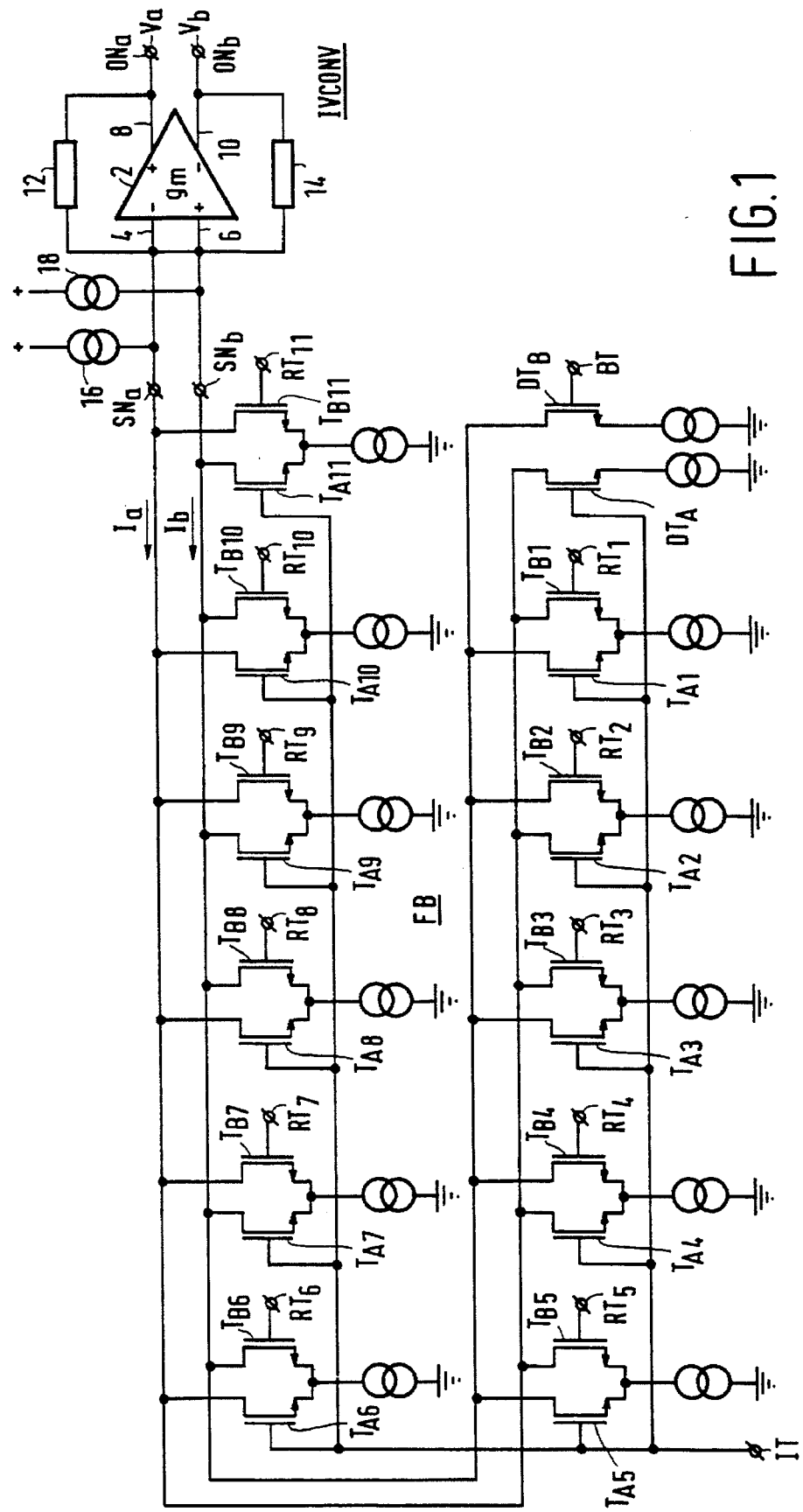
FIG. 1 shows a circuit diagram of a first embodiment of a folding stage according to the invention.
Figure 2:
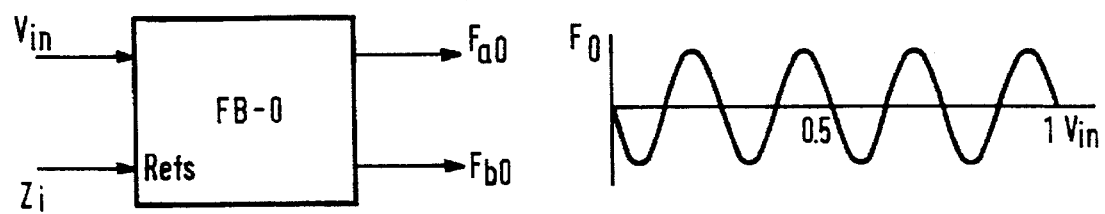
FIG. 2 shows a block diagram of a folding stage and its associated folding signal.

FIG. 1 shows an eight times folding stage FB with unipolar MOS transistors. However, bipolar transistors can be used as well. The control electrode, first main electrode and second main electrode correspond to the gate, source and drain, respectively, of an unipolar transistor and to the base, emitter and collector, respectively, of a bipolar transistor. Eight times folding means that eight zerocrossings are generated when the input voltage traverses its specified input voltage range. FIG. 2 shows the functioning of the folding stage FB which generates an eight times folded signal $F_0$. The folding signal $F_0$ is represented by the differential output currents $F_{ao}$ and $F_{bo}$:

$$F_0 = F_{ao} - F_{bo} \quad (1)$$

For high speed A/D conversion, generation of differential signals is highly preferred. When the A/D converter is embedded in, for example, a noisy digital signal processor, differential operation greatly improves the reliability and robustness. The folding signal $F_0$ has its zerocrossings $Z_i$ at input voltage $V_{in}$ values:

$$Z_i = i*(V_{rng}/8); i=0 \ldots 8 \quad (2)$$

$V_{rng}$ being the input voltage range. The folding signal $F_0$ has the shape of a sine wave in the actual folding stage realisation. But, as known from the art, the shape of the waveform is not relevant, only the positions of the zerocrossings contain information.

Turning back to FIG. 1, the folding stage FB has an input terminal IT for receiving the input voltage $V_{in}$. Reference means are provided with eleven reference terminals $RT_1 \ldots RT_{11}$ for providing eleven ascending different reference voltages. A conventional resistor ladder can be used for this purpose. The folding stage FB has a first summing node $SN_a$, a second summing node $SN_b$, eleven differentially coupled transistor pairs and a dummy structure consisting of a first dummy transistor $DT_A$ and a second dummy transistor $DT_B$. Each differential pair comprises a first transistor $T_{Ai}$ having a gate coupled to the input terminal IT and a second transistor $T_{Bi}$ having a gate coupled to a respective one $RT_i$ of the consecutive reference terminals. The main current path of the first transistor $T_{Ai}$ of consecutive transistor pairs is coupled alternately to the first summing node $SN_a$ and the second summing node $SN_b$. The main current path of the other transistor $T_{Bi}$ of the pair is coupled alternately to the second summing node $SN_b$ and the first summing node $SN_a$. In all differential transistor pairs the sources of the first and second transistors are interconnected and coupled to a current source. The gate, drain and source of the first dummy transistor $DT_A$ are connected to, respectively, the input terminal IT, the first summing node $SN_a$ and a current source similar to the current sources of the differential transistor pairs. The gate, drain and source of the second dummy transistor $DT_B$ are connected to, respectively, a bias voltage terminal BT for receiving a suitable fixed bias voltage, the second summing node $SN_b$ and a current source similar to the current sources of the differential transistor pairs.

The folding stage generates an eight times folding signal by means of eleven differential transistor pairs and the dummy structure. Nine differential transistor pairs, i.e. the pairs connected to the reference terminals $RT_2$ to $RT_{10}$ are needed to generate the zerocrossings $Z_i$ from equation 2 above. The other two differential transistor pairs, i.e. the pairs connected to reference terminals $RT_1$ and $RT_{11}$ are optional and may be deleted. They generate void zerocrossings at $(\frac{1}{8})*V_{rng}$ outside the region of the input voltage $V_{in}$. By this extension of the folding structure outside the input voltage range $V_{rng}$, all valid differential transistor pair transfer curves (the pairs connected to the reference terminals $RT_2$ to $RT_{10}$) are equally influenced by the transfer curves of their adjacent differential transistor pairs and accuracy of the folding system is improved. It is to be noted that under circumstances only eight differential pairs are sufficient to generate the zerocrossings needed. In such cases the number of differential pairs can be one less, or in the alternative, three pairs are connected to generate void zerocrossings outside the input voltage range. The dummy structure reduces the capacitive error current in the differential output current $I_a - I_b$ caused by the gate-source capacitances and the junction capacitance at the common source node of the transistors in the differential transistor pairs and improves the accuracy of the folding system. This is explained as follows.

The differential pairs have three regions of operation:

1. $V_{in} < V_{ref}$ and the pair is not in its decision region: the voltage at the common source of the pair is constant.
2. $V_{in} \approx V_{ref}$: the pair is in its decision region.
3. $V_{in} > V_{ref}$ and the pair is not in its decision region: the common source voltage will follow the input voltage.

$V_{ref}$ is the reference voltage of the pertinent reference voltage terminal. Two types of parasitic capacitances are considered: the gate-source ($C_{gs}$) capacitance of the differential pair transistors and the junction capacitance at the common source node of the differential pairs. The $C_{gs}$ capacitance of the transistors with the gate connected to the input voltage $V_{in}$ will introduce an error current in the folding current mainly if $V_{in} < V_{ref}$. The common source node junction capacitance will introduce an error current if $V_{in} > V_{ref}$. As a result of the cross-coupled differential pair construction of the folding stage, error currents due to these $C_{gs}$ capacitances will compensate the error current due to the common source function capacitance partly. The $C_{gs}$ capacitances of the differential pair transistors with a gate connected to a reference voltage and with $V_{in} > V_{ref}$ can be added to the common source node junction capacitance. The error current due to these capacitances will be modeled as a single error current $I_e$ in the tail current $I_s$ of the differential pair. Currents $I_d$ and $(I_s - I_d)$ represent the contribution of the differential pair in its decision region to the folding currents $I_a$ and $I_b$. Neglecting the dummy structure, the folding currents $I_a$ and $I_b$ satisfy the following expressions:

$$I_a = I_{cm} + \alpha I_e + I_d \quad (3)$$

$$I_b = I_{cm} + \beta I_e + (I_s - I_d) \quad (4)$$

where $I_{cm}$ is the common mode current component.
The differential output current $(I_a - I_b)$ satisfies:

$$I_a - I_b = (\alpha - \beta) I_e + (2I_d - I_s) \quad (5)$$

The $(2I_d - I_s)$ component in expression 5 defines the ideal differential folding current. The $(\alpha - \beta) I_e$ component defines the additional capacitive error current. In the above equations $\alpha$ defines the number of differential pairs for which $V_{in} > V_{ref}$ and for which the tail current $I_s$ contributes to the $I_a$ folding current. Analogous, this yields for $\beta$ with respect to the $I_b$ folding current. For simplicity, the differential pair which is in its decision region will not be regarded in this analysis. Considering the construction of the folding stage FB, the following two relation between $\alpha$ and $\beta$ can be stated:

$$\beta = \alpha \quad (6)$$

$$\beta = \alpha + 1 \quad (7)$$

Either equation 6 is true or equation 7 is true. When equation 6 is true, equation 5 yields:

$$I_a-I_b=(2I_d-I_s) \tag{8}$$

This means a full cancellation of the error currents. However, the second relation between α and β in equation 7 results in the next expression for the differential folding current:

$$I_a-I_b=-I_e+(2I_d-I_s) \tag{9}$$

An absolute differential error current $I_e$ may result in shifted zerocrossings in the folding signal. The dummy structure realizes a 50% of the absolute error current. The dummy structure consists of two source followers which in DC operation both contribute a common $-I_s$ current to the folding currents $I_a$ and $I_b$. The parasitic capacitances of the first dummy transistor $DT_A$ result in $\approx\frac{1}{2}I_e$ error current in the drain current of the first dummy transistor $DT_A$. In the case of equation 6, the differential output current of the folding stage including the dummy structure satisfies:

$$I_a-I_b=(2I_d-I_s)+\tfrac{1}{2}I_e \tag{10}$$

In the case of equation 7, the differential output current of the folding stage including the dummy structure satisfies:

$$I_a-I_b=-\tfrac{1}{2}I_e+(2I_d-I_s) \tag{11}$$

From equations 10 and 11 it can be observed that the absolute maximum differential error current in the folding signal decreases to $\frac{1}{2}I_e$.

The high speed excitation of the folding stage FB introduces further disadvantageous effects. As explained before, a full swing 10 MHz sine wave input signal $V_{in}$ leads to an internal frequency of 125 MHz in the output currents $I_a$ and $I_b$. Parasitic capacitances of the transistors $T_{Ai}$ and $T_{Bi}$ of the differential pairs may deteriorate the output currents $I_a$ and $I_b$. The currents through the parasitic capacitances can be relatively large compared to the differential current swing and may reduce the accuracy of the desired performance. It is therefore advantageous to keep the voltage swing at the summing nodes $SN_a$ and $SN_b$ as small as possible to prevent unacceptable capacitive currents through the parasitic capacitances. For this purpose a current-to-voltage converter IVCONV is connected to the summing nodes $SN_a$ and $SN_b$. The current-to-voltage converter IVCONV is a balanced transconductance stage 2 having an inverting input 4 connected to the first summing node $SN_a$, a non-inverting input 6 connected to the second summing node $SN_b$, a non-inverting output 8 connected to a first output node $ON_a$ and an inverting output 10 connected to a second output node $ON_b$. A first resistor 12 is connected between the first summing node $SN_a$ and the first output node $ON_a$ and a second resistor 14 is connected between the second summing node $SN_b$ and the second output node $ON_b$. The transconductance stage 2 has a transconductance $g_m$, which means that the ratio between the differential output current flowing in the outputs 8 and 10 and the differential input voltage over the inputs 4 and 6 is equal to $g_m$. The input impedance and the output impedance of the current-to-voltage converter IVCONV are both equal to $1/g_m$. The voltage gain of the current-to-voltage converter IVCONV is proportional to the resistance R of the first and second resistors 12 and 14 and output voltages $V_a$ and $V_b$ are provided at output nodes $ON_a$ and $ON_b$. When the folding stage is to be used in an interpolating and folding A/D converter, a string of impedance elements, preferably resistors, is to be connected between the corresponding output nodes of two consecutive folding stages. Since the interpolation reduces the amplitude of the interpolated signals, the output voltage at the output nodes should be sufficiently high. The current-to-voltage converter IVCONV enables a separate design of the output voltage swing at the output nodes $SN_a$ and $SN_b$ and the output impedance by selecting suitable values for the resistance R of the first and second resistors 12, 14 and for the transconductance $g_m$ of the transconductance stage 2. In this way the impedance of the interpolation network can be kept low without decreasing the voltages of the interpolated folding signals. A low impedance level of the interpolation network is less sensitive to parasitic capacitances and thus allows higher speed.

It is to be noted that the current-to-voltage converter IVCONV can also be a single ended version. In that case, for example, resistor 14 and the inverting output 10 are omitted and non-inverting input 6 is coupled to a suitable bias voltage.

Figure 3:
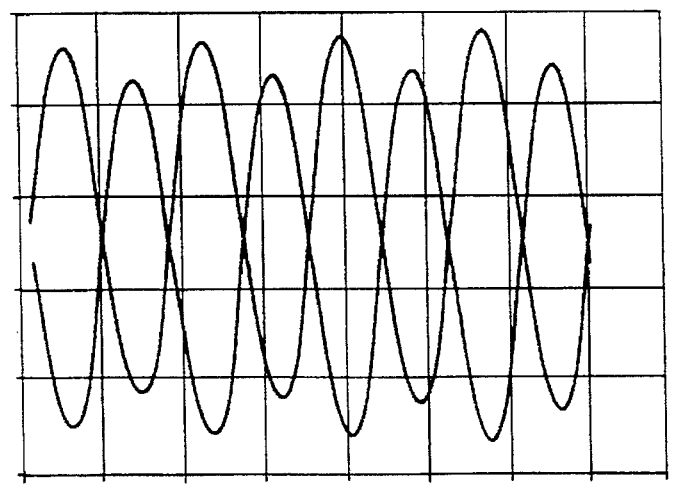
FIG. 3 shows waveforms of output signals of a folding stage with mismatch in the bias currents.
Figure 4:
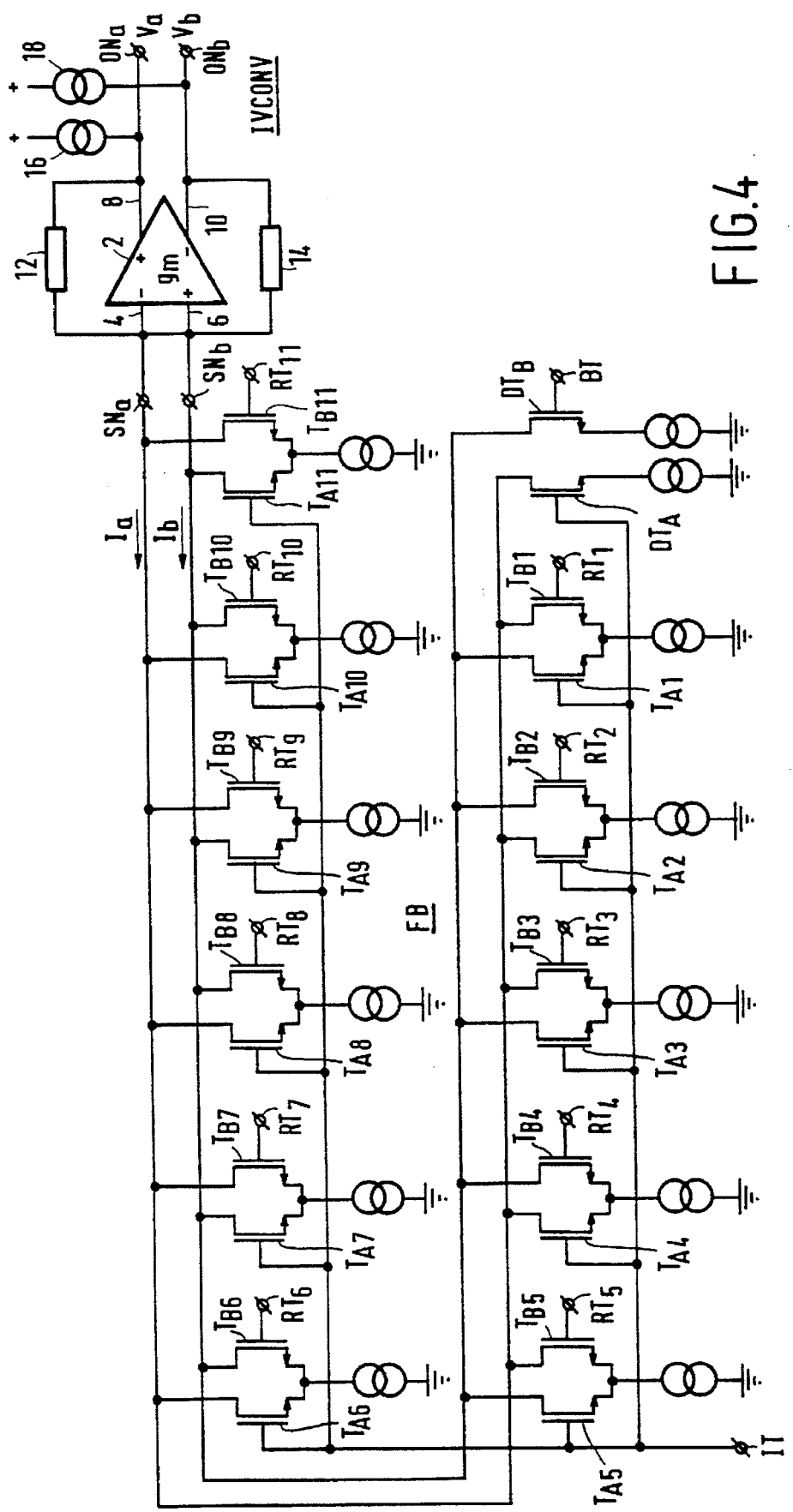
FIG. 4 shows a circuit diagram of a second embodiment of a folding stage according to the invention.
Figure 5A:
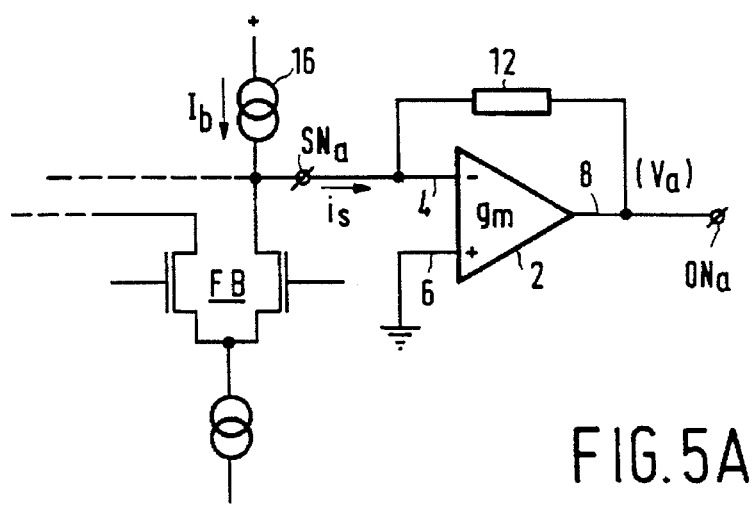
FIG. 5A and FIG. 5B show circuit details of the first and second embodiments of a folding stage according to the invention.
Figure 5B:
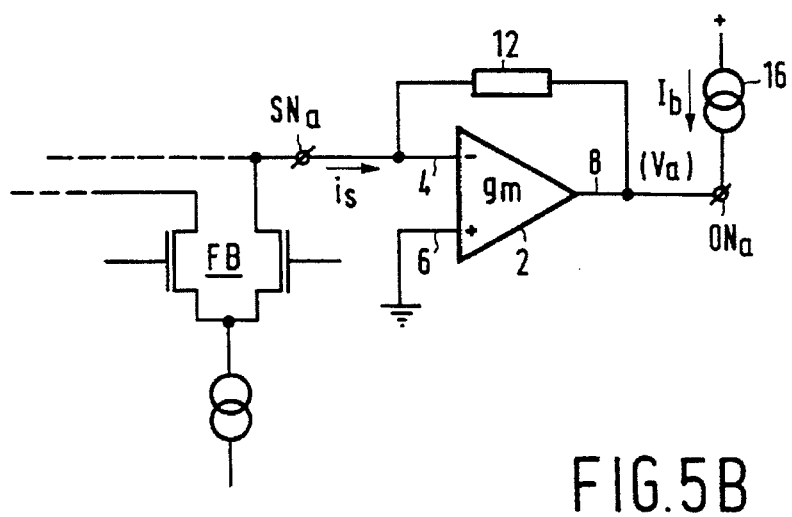

The differential transistor pairs of the folding stage FB need DC bias current. Two bias current sources are provided for this purpose. A first bias current source 16 is connected to the first summing node $SN_a$ and a second bias current source 18 is connected to the second summing node $SN_b$. However, a mismatch between the two bias current sources causes an offset in the output currents of the folding stage FB and non-linearity errors in the A/D conversion. FIG. 3 shows the effect of this offset in the signal waveforms of $V_a$ and $V_b$. The effect of the mismatch can be reduced by moving the bias current sources from the summing nodes $SN_a$, $SN_b$ to the output nodes $ON_a$ and $ON_b$ as shown in FIG. 4. This is illustrated in FIGS. 5A and 5B where for simplicity reasons only a single ended version of the circuitry is drawn. A signal current $i_s$ flows from the folding stage to the current-to-voltage converter. Assume that the bias current $I_b$ of bias current source 16 in FIG. 5A has a certain mismatch $\delta I_b$ in respect of its nominal value $I_{b,nom}$:

$$I_b=I_{b,nom}+\delta I_b \tag{12}$$

The output voltage $V_{a,A}$ at the output node can be written in the form:

$$V_{a,A}=-i_sR-\delta I_bR=V_{a,nom}+\delta V_{a,A} \tag{13}$$

$V_{a,nom}$ is the nominal output voltage and R the resistance of resistor 12.

Consider now FIG. 5B, where the bias current source 16 is moved from the summing node $SN_a$ to the output node $ON_a$. The bias current for the folding stage FB now flows through the resistor 12. Mismatch in the current $I_b$ of current source 16 results in an offset voltage of the transconductance stage 2 which is added to the nominal output voltage $V_{a,nom}$:

$$V_{a,B}=-i_sR-(\delta I_b)g_m=V_{a,nom}+\delta V_{a,B} \tag{14}$$

Comparing equations 13 and 14 it can be seen that an error $\delta I_b$ in the bias current $I_b$ has a factor $g_mR$ less effect in the configuration of FIG. 5B.

Figure 6:
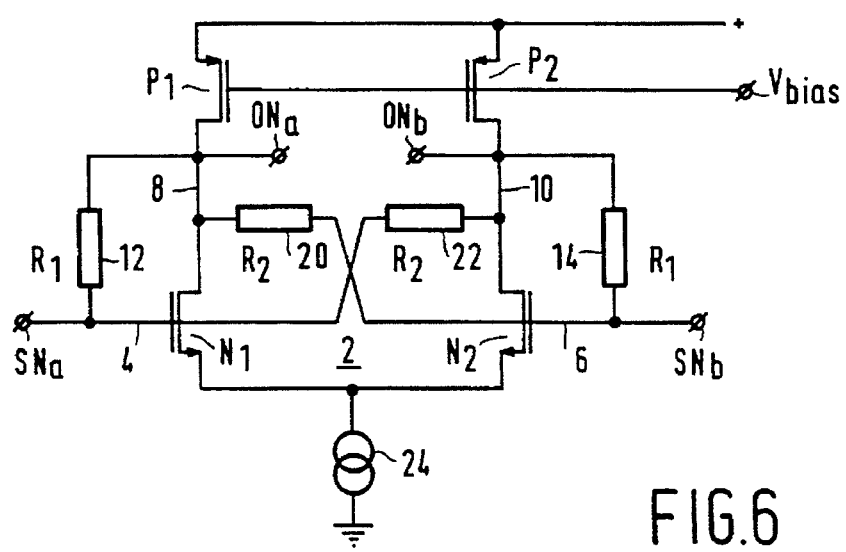
FIG. 6 shows a circuit diagram of a current-to-voltage converter for use in a folding stage according to the invention.

FIG. 6 shows a practical implementation of the current-to-voltage converter IVCONV. A differential transistor pair has first and second N-channel transistors $N_1$, $N_2$ having sources coupled to ground via a common bias current source 24. The gate of transistor $N_1$ is the non-inverting input 4 which is connected to the first summing node $SN_a$, the gate of transistor $N_2$ is the inverting input 6 which is connected to the second summing node $SN_b$, the drain of transistor $N_1$ is the non-inverting output 8 which is connected to the fist output node $ON_a$ and the drain of transistor $N_2$ is the inverting output 10 which is connected to the second output node $ON_b$. The drain of a P-channel transistor $P_1$ is connected to the drain of transistor $N_1$ and provides bias current to transistor $N_1$ and via resistor 12 to the summing node $SN_a$ of the folding stage. Similarly a P-channel transistor $P_2$ provides bias current to transistor $N_2$ and via resistor 14 to the summing node $SN_b$ of the folding stage. The sources of transistors $P_1$ and $P_2$ are connected to a suitable positive supply voltage, whereas the gates are connected to a suitable bias voltage $V_{bias}$. Optionally, two cross-coupled resistors may be added. A first cross-coupled resistor 20 is connected between the drain of transistor $N_1$ and the gate of transistor $N_2$. A second cross-coupled resistor 22 is connected between the drain of transistor $N_2$ and the gate of transistor $N_1$. The advantage is a lower DC voltage drop between the output nodes $ON_a$, $ON_b$ and the summing nodes $SN_a$, $SN_b$, while maintaining differential signal amplification. For common-mode signals (bias currents) the resistors 12 and 22 are seen in parallel and also the resistors 14 and 20 are seen in parallel:

$$\text{common mode: } R_{par}=(R_1R_2)/(R_1+R_2) \qquad (15)$$

$R_1$ is the resistance of resistors 12 and 14 and $R_2$ is the resistance of resistors 20 and 22. For differential mode signals (signal currents) the resistors are again seen in parallel, but now with a minus sign for the cross-coupled resistors 20, 22:

$$\text{differential mode: } R_{par}=-(R_1R_2)/(R_1-R_2) \qquad (16)$$

In this way a low common mode gain and a high differential mode gain can be obtained.

The invention is not limited to the eight times folding stage as shown in the Figures. Any number of foldings is possible by selecting a suitable number of differential transistor pairs and by adapting the reference means accordingly. Bipolar transistors may be used instead of the shown unipolar transistors. Transistors of the opposite polarity can be used as well.

It is claimed:

1. A folding stage for a folding analog-to-digital converter, the folding stage comprising:

an input terminal for receiving an input voltage to be folded;

reference means having a plurality of consecutive reference terminals for providing ascending different reference voltages;

a first summing node and a second summing node;

a plurality of differentially coupled transistor pairs, each one of the pairs comprising a current source, a first transistor having a first main electrode coupled to the current source and a control electrode coupled to the input terminal and a second transistor having a first main electrode coupled to the current source and a control electrode coupled to a respective one of the consecutive reference terminals, a second main electrode of the first transistor of consecutive transistor pairs being coupled alternately to the first summing node and the second summing node, and a second main electrode of the associated second transistor being coupled alternately to the second summing node and the first summing node, wherein the folding stage further comprises a dummy structure comprising a first current source, a first dummy transistor having a control electrode coupled to the input terminal, a first main electrode connected to the first current source and a second main electrode coupled to one of the first and second summing nodes, a second current source, and a second dummy transistor having a control electrode coupled to a bias voltage terminal, a first main electrode connected to the second current source and a second main electrode coupled to the other of the first and second summing nodes.

2. A folding stage a claimed in claim 1, wherein in at least two of the plurality of differentially coupled transistor pairs the control electrode of the second transistor is coupled to a reference terminal supplying a reference voltage which lies outside the voltage range of the input voltage to be folded.

3. A folding stage as claimed in claim 2, which further comprises:

a first output node;

current-to-voltage converter means comprising a first resistor connected between the first summing node and the first output node to provide a first output voltage and having an input coupled to the first summing node and a transconductance stage having an inverting input coupled to the first summing node and an output coupled to the first output node.

4. A folding stage as claimed in claim 3, which further comprises a first bias current source coupled to the first output node for providing a first bias current to the first summing node via the first resistor.

5. A folding stage as claimed in claim 4, which further comprises a second output node;

the current-to-voltage converter means further comprises a second resistor connected between the second output node and the second summing node to provide a second output voltage; and the transconductance stage has a non-inverting input coupled to the second summing node and an inverting output coupled to the second output node.

6. A folding stage as claimed in claim 5, which further comprises a second bias current source coupled to the second output node for providing a second bias current to the second summing node via the second resistor.

7. A folding stage as claimed in claim 6, wherein the transconductance stage comprises a first transistor and a second transistor having first main electrodes coupled to a common current source, having respective second main electrodes coupled to the first output node and the second output node, respectively, and having respective control electrodes coupled to the first summing node and the second summing node, respectively.

8. A folding stage as claimed in claim 7, wherein the transconductance stage further comprises a third resistor connected between the first output node and the second summing node and a fourth resistor connected between the second output node and the first summing node.

9. A folding stage as claimed in claim 1, which further comprises:

a first output node;

current-to-voltage converter means comprising a first resistor connected between the first summing node and the first output node to provide a first output voltage and having an input coupled to the first summing node and a transconductance stage having an inverting input coupled to the first summing node and an output coupled to the first output node.

10. A folding stage as claimed in claim 9, which further comprises a first bias current source coupled to the first output node for providing a first bias current to the first summing node via the first resistor.

11. A folding stage as claimed in claim 10 which further comprises a second output node;

the current-to-voltage converter means further comprises a second resistor connected between the second output node and the second summing node to provide a second output voltage; and the transconductance stage has a non-inverting input coupled to the second summing node and an inverting output coupled to the second output node.

12. A folding stage as claimed in claim 11, which further comprises a second bias current source coupled to the second output node for providing a second bias current to the second summing node via the second resistor.

13. A folding stage as claimed in claim 9 which further comprises a second output node;

the current-to-voltage converter means further comprises a second resistor connected between the second output node and the second summing node to provide a second output voltage; and the transconductance stage has a non-inverting input coupled to the second summing node and an inverting output coupled to the second output node.

14. A folding stage as claimed in claim 13 wherein the transconductance stage comprises a first transistor and a second transistor having first main electrodes coupled to a common current source, having respective second main electrodes coupled to the first output node and the second output node, respectively, and having respective control electrodes coupled to the first summing node and the second summing node, respectively.

15. A folding stage as claimed in claim 14, wherein the transconductance stage further comprises a third resistor connected between the first output node and the second summing node and a fourth resistor connected between the second output node and the first summing node.

* * * * *